(12) United States Patent
Zhou et al.

(10) Patent No.: US 11,908,743 B2
(45) Date of Patent: Feb. 20, 2024

(54) PLANAR DEVICES WITH CONSISTENT BASE DIELECTRIC

(71) Applicant: INTERNATIONAL BUSINESS MACHINES CORPORATION, Armonk, NY (US)

(72) Inventors: Huimei Zhou, Albany, NY (US); Andrew M. Greene, Slingerlands, NY (US); Julien Frougier, Albany, NY (US); Ruqiang Bao, Niskayuna, NY (US); Jingyun Zhang, Albany, NY (US); Miaomiao Wang, Albany, NY (US); Dechao Guo, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 332 days.

(21) Appl. No.: 17/485,601

(22) Filed: Sep. 27, 2021

(65) Prior Publication Data
US 2023/0102261 A1    Mar. 30, 2023

(51) Int. Cl.
*H01L 21/8234* (2006.01)
*H01L 29/06* (2006.01)
(Continued)

(52) U.S. Cl.
CPC ........... *H01L 21/823431* (2013.01); *H01L 21/823412* (2013.01); *H01L 21/823462* (2013.01);
(Continued)

(58) Field of Classification Search
CPC ..... H01L 21/823412; H01L 21/823431; H01L 21/823462; H01L 21/823481; H01L 22/12;
(Continued)

(56) References Cited

U.S. PATENT DOCUMENTS 9,105,745 B2   8/2015  Ando et al.
9,257,545 B2   2/2016  Leobandung
(Continued)

FOREIGN PATENT DOCUMENTS

CN    1591838 A    3/2005

OTHER PUBLICATIONS

Lin, Yu-Ru, et al. "Performance of Junctionless and inversion-mode thin-film transistors with stacked Nanosheet channels", IEEE Transactions on Nanotechnology, vol. 19. Dec. 25, 2019, pp. 84-88.
(Continued)

*Primary Examiner* — Cheung Lee
(74) *Attorney, Agent, or Firm* — Tutunjian & Bitetto, P.C.; Samuel Waldbaum

(57) ABSTRACT

Semiconductor devices, integrated chips, and methods of forming the same include forming a fill over a stack of semiconductor layers. The stack of semiconductor layers includes a first sacrificial layer and a set of alternating second sacrificial layers and channel layers. A dielectric fin is formed over the stack of semiconductor layers. The first sacrificial layer and the second sacrificial layers are etched away, leaving the channel layers supported by the dielectric fin over an exposed substrate surface. A dielectric layer is conformally deposited on the exposed substrate surface, the dielectric layer having a consistent thickness across the top surface. A conductive material is deposited over the dielectric layer.

19 Claims, 8 Drawing Sheets

(51) Int. Cl.
*H01L 29/786* (2006.01)
*H01L 29/423* (2006.01)

(52) U.S. Cl.
CPC .. *H01L 21/823481* (2013.01); *H01L 29/0665* (2013.01); *H01L 29/42392* (2013.01); *H01L 29/78696* (2013.01)

(58) Field of Classification Search
CPC . H01L 22/34; H01L 29/0665; H01L 29/0673; H01L 29/42392; H01L 29/66439; H01L 29/66795; H01L 29/775; H01L 29/785; H01L 29/78696
See application file for complete search history.

(56) References Cited

U.S. PATENT DOCUMENTS

| | | | |
|---|---|---|---|
| 10,014,389 B2 | 7/2018 | Xie et al. | |
| 10,115,721 B2 | 10/2018 | Hafez et al. | |
| 10,347,657 B1 | 7/2019 | Leobandung | |
| 10,439,039 B2 | 10/2019 | Song et al. | |
| 2017/0323953 A1 | 11/2017 | Cheng | |
| 2018/0033871 A1* | 2/2018 | Xie | H01L 21/02532 |
| 2019/0333990 A1 | 10/2019 | Lilak et al. | |
| 2019/0378906 A1 | 12/2019 | Loubet et al. | |
| 2021/0184051 A1 | 6/2021 | Trivedi | |
| 2021/0202749 A1 | 7/2021 | Zhang | |
| 2021/0225839 A1 | 7/2021 | Lin | |
| 2021/0265508 A1 | 8/2021 | Chiang | |

OTHER PUBLICATIONS

Dash, T.P., et al. "Vertically-stacked silicon nanosheet field effect transistors at 3nm technology nodes", In2019 Devices for Integrated Circuit (DevIC). Mar. 23, 2019, pp. 99-103.

International Search Report issued in corresponding PCT Application Serial No. PCT/CN2022/109699 dated Oct. 31, 2022, 4 pgs.

* cited by examiner

PLANAR DEVICES WITH CONSISTENT BASE DIELECTRIC

BACKGROUND

The present invention generally relates to semiconductor device manufacture, and, more particularly, to semiconductor devices that can test gate oxide thickness formed in body isolation processes.

Body isolation processes may form devices with inconsistent body isolation layers, which makes testing the thickness of the gate oxide challenging.

SUMMARY

A method of forming a semiconductor device includes forming a fill over a stack of semiconductor layers. The stack of semiconductor layers includes a first sacrificial layer and a set of alternating second sacrificial layers and channel layers. A dielectric fin is formed over the stack of semiconductor layers. The first sacrificial layer and the second sacrificial layers are etched away, leaving the channel layers supported by the dielectric fin over an exposed substrate surface. A dielectric layer is conformally deposited on the exposed substrate surface. The dielectric layer has a consistent thickness across the top surface. A conductive material is deposited over the dielectric layer.

A semiconductor device includes a dielectric layer directly on a top surface of a substrate. The dielectric layer has a consistent thickness across the top surface. A conductive layer is on the dielectric layer. A first dielectric fin is on the substrate. Semiconductor layers, vertically stacked above the dielectric layer, are supported by the first dielectric fin.

An integrated chip includes a transistor device and a planar device. The transistor device includes a body isolation layer on a substrate, a nanosheet channel over the body isolation layer, a gate conductor, and a gate dielectric material between the gate conductor and the body isolation layer. The planar device includes a gate dielectric material directly on a top surface of the substrate, a conductive layer on the dielectric layer, a first dielectric fin on the substrate, and a semiconductor layer supported by the first dielectric fin. The gate dielectric material of the planar device has a consistent thickness across the top surface.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

To test gate dielectric thickness, for example on an integrated chip, a voltage may be applied between a gate contact and a substrate, and the current that passes through the gate dielectric may be measured. From this current, a corresponding resistance, and thus a thickness, of the gate dielectric can be determined.

However, some styles of integrated chip use body isolation processes that separate the channels of a stacked nanosheet transistor from the substrate with a dielectric layer. In such chips, the body isolation dielectric layer may be formed inconsistently, making it challenging to determine how much of the resistance is due to the body isolation dielectric layer and how much of the resistance is due to the gate dielectric layer.

A planar semiconductor device may be formed on an integrated chip, along with body isolation nanosheet transistor devices. The planar semiconductor device may not include the body isolation dielectric layer that is present in the body isolation nanosheet transistor devices, thereby making it easier to test the thickness of a gate dielectric layer. To accomplish this, a region having a stack of channel layers may be masked to prevent formation of inner spacers and source/drain growth.

Figure 1:
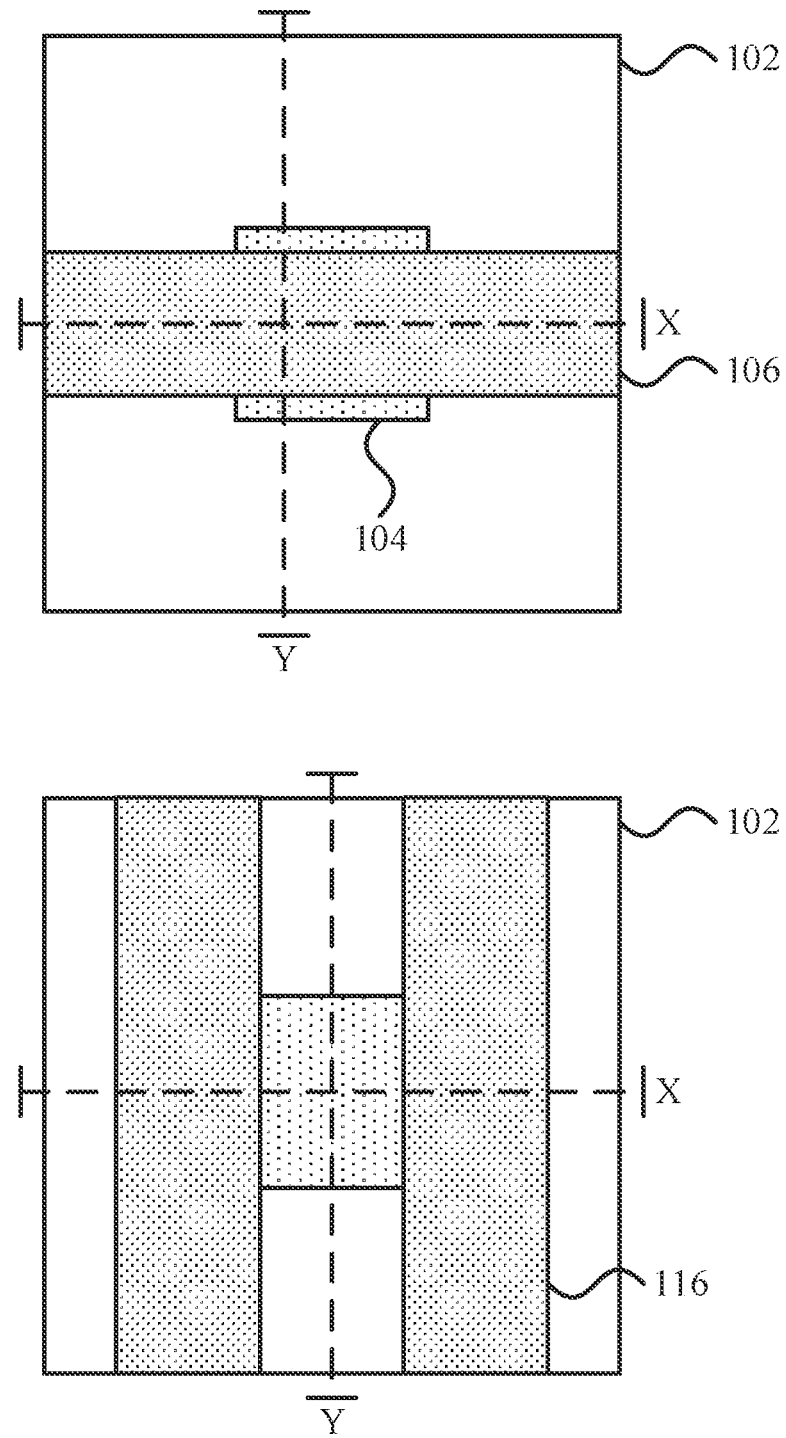
FIG. 1 is a top-down view of embodiments of a planar semiconductor device, where dielectric fins are formed over a stack of channel layers to support sidewalls of the channel layers, in accordance with an embodiment of the present invention.

Referring now to the drawings in which like numerals represent the same or similar elements and initially to FIG. 1, a top-down view of two different embodiments of a semiconductor device are shown. A semiconductor substrate 102 has a stack of layers 104 formed on it. Each embodiment shows a layer of dielectric material that contacts the stack of layers 104. In a first embodiment, the layers of dielectric material 106 may cross the center of the stack of layers 104. In a second embodiment, the layers of dielectric material 116 may cross over the ends of the stack of layers 104.

In both cases, the layers 106/116 of the dielectric material cover ends of the stacks of layers 104. These structures thereby provide structural support for the sidewalls of the component layers of the stack of layers 104. In particular, channel nanosheets in the stack of layers may be supported and suspended when sacrificial material is removed, as will be described in greater detail below. The layers 106/116 of dielectric material thereby suspend remaining layers, preventing them from being damaged or destroyed during subsequent processing steps. Two distinct cross-sections are shown, X and Y. These cross-sections will be referred to herein to show different features in different views of various fabrication steps.

Figure 2:
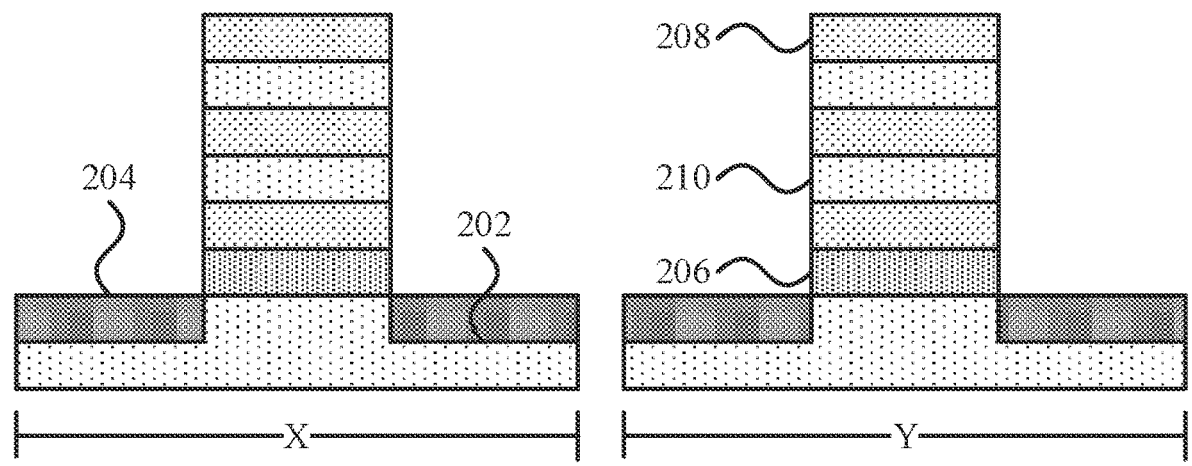
FIG. 2 is a cross-sectional view of cross-sections X and Y of a step in the fabrication of a planar semiconductor device, showing the formation of a device stack from a stack of semiconductor layers, in accordance with an embodiment of the present invention.

Referring now to FIG. 2, cross-sections of a step in the fabrication of a semiconductor device are shown, including views along two perpendicular cross-sections, X and Y. A semiconductor substrate 202 is processed to form shallow trench isolation (STI) regions 204. A stack of layers is formed on a device region of the substrate 202, with the stack including a first sacrificial semiconductor layer 206 and alternating layers on the first sacrificial semiconductor layer 206, the alternating layers including second sacrificial semiconductor layers 208 and channel layers 210. Although two channel layers 210 are shown, any appropriate number of channel layers 210 may be formed in this manner, with second sacrificial semiconductor layers 208 being interposed between vertically adjacent pairs of channel layers 210.

It should be understood that, although the term "channel" is used herein, these structures need not function as channels of a transistor. It is contemplated that the present embodiments may be implemented using a device fabrication flow that manufactures multiple devices at once, potentially including body isolation nanosheet field effect transistors (FETs) elsewhere on the chip Thus, the channel layers 210 may correspond to channel layers of other devices on the same integrated chip, not shown, and may be fabricated using the same processes used to form the channels of those devices.

The semiconductor substrate 202 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 202 may also be a semiconductor on insulator (SOI) substrate.

The STI regions 204 may be formed by etching a trench in the substrate 202, for example using an anisotropic dry etching process, such as reactive-ion etching (RIE) or plasma etching. The trenches may optionally be lined with a conventional liner material, e.g., an oxide, and then any appropriate deposition process may be used to fill the trench with polysilicon, silicon dioxide, or another like STI dielectric material. The STI dielectric may optionally be densified after deposition. A planarization process, such as chemical-mechanical polishing (CMP) may optionally be used to provide a planar structure, the exposed surface of the substrate thus including distinct semiconductor regions and STI regions.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

CMP is performed using, e.g., a chemical or granular slurry and mechanical force to gradually remove upper layers of the device. The slurry may be formulated to be unable to dissolve, for example, the semiconductor material, resulting in the CMP process's inability to proceed any farther than that layer.

The stack of semiconductor layers may be formed by epitaxially growing each semiconductor layer from the top surface of the last, starting with growing the first sacrificial semiconductor layer 206 from the top surface of the semiconductor substrate 202. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

In one illustrative example, the first sacrificial semiconductor layer 206 may be formed from silicon germanium having a first germanium concentration, the second sacrificial layers 208 may be formed from silicon germanium having a second germanium concentration, and the channel layers may be formed from elemental silicon. The germanium concentrations of the first sacrificial layer 206 and the second sacrificial layers 208 may be selected to provide etch selectivity with respect to one another, and with respect to the channel layers 210.

In one illustrative embodiment, the first germanium concentration may be about 40% and the second germanium concentration may be about 20%, but it should be understood that other concentrations are also contemplated. The first sacrificial layer 206 may have a higher concentration of germanium than the second sacrificial layers 208. This makes it possible to selectively remove the first sacrificial layer 206, while leaving the second sacrificial layers 208 relatively intact, which may be used on other devices in the same integrated chip to create space for a body isolation dielectric layer.

As used herein, the term "selective" in reference to a material removal process denotes that the rate of material removal for a first material is greater than the rate of removal for at least another material of the structure to which the material removal process is being applied. Thus, the first sacrificial layer 206 may be etched away without substantially damaging the second sacrificial layers 208 and the channel layers 210, and the second sacrificial layers 208 can be etched away without substantially damaging the channel layers.

Figure 3:
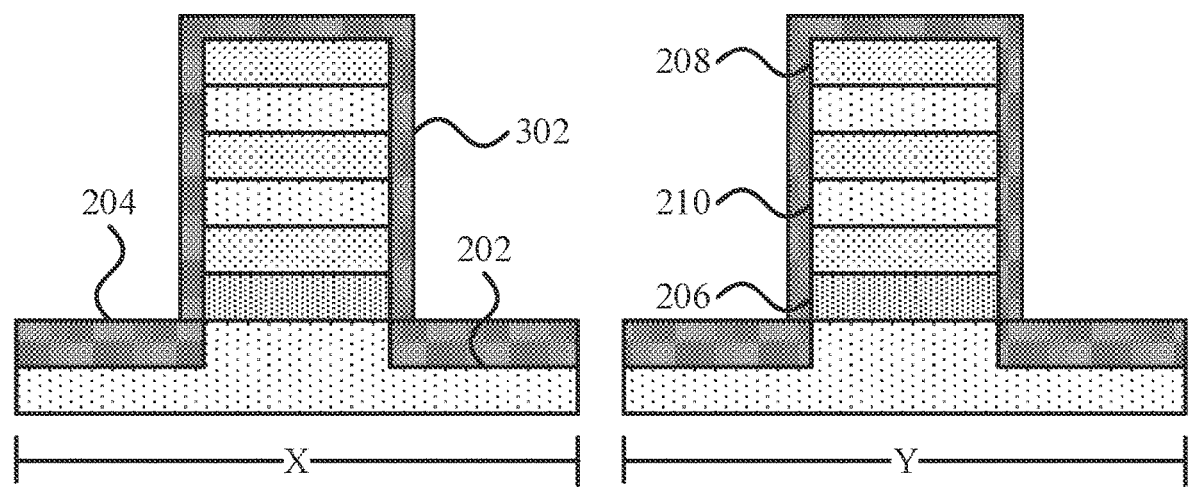
FIG. 3 is a cross-sectional view of cross-sections X and Y of a step in the fabrication of a planar semiconductor device, showing the formation of a dielectric liner over the device stack, in accordance with an embodiment of the present invention.

Referring now to FIG. 3, cross-sections of a step in the fabrication of a semiconductor device are shown, including views along two perpendicular cross-sections, X and Y. A dielectric liner 302 is formed over the stacks of layers. This dielectric liner may be formed from any appropriate dielectric material, such as silicon dioxide, and may be formed using any appropriate conformal deposition process, including, e.g., chemical vapor deposition (CVD) or atomic layer deposition (ALD).

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use ALD, chemical precursors react with the surface of a material one at a time to deposit a thin film on the surface.

Figure 4:
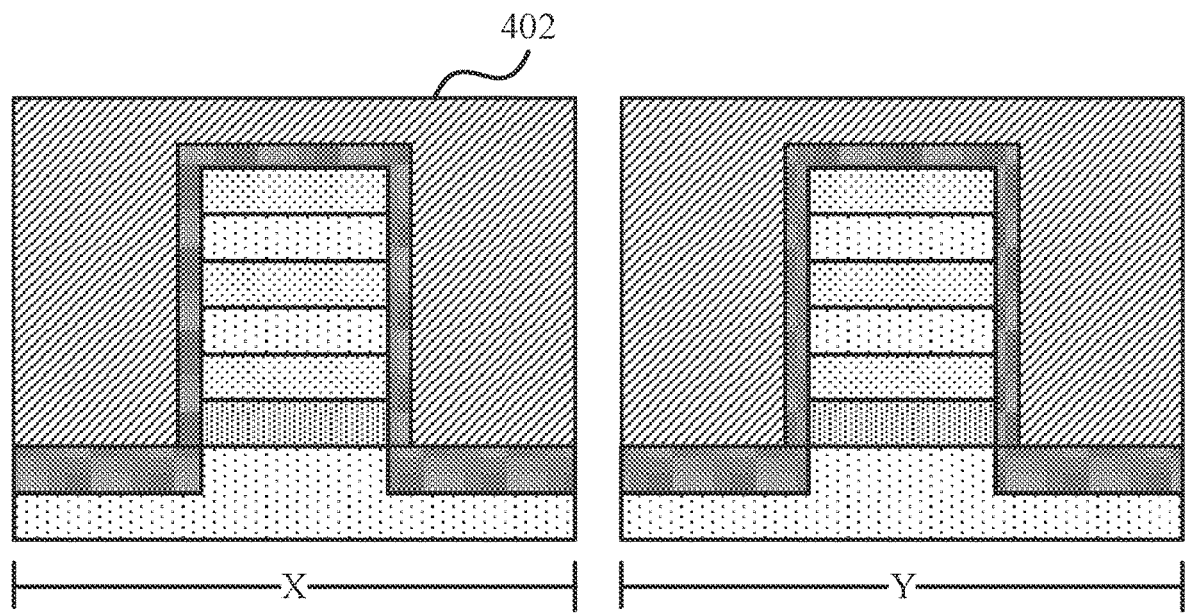
FIG. 4 is a cross-sectional view of cross-sections X and Y of a step in the fabrication of a planar semiconductor device, showing the formation of a fill material over the device stack, in accordance with an embodiment of the present invention.

Referring now to FIG. 4, cross-sections of a step in the fabrication of a semiconductor device are shown, including views along two perpendicular cross-sections, X and Y. A layer of fill material 402 is deposited over the stack of layers. The deposited material may be any material that has etch selectivity with the liner 302, the STI 204, and subsequent materials as described below. For example, polysilicon may be used, which may be part of a dummy gate fabrication process for other devices on the same chip. For example, the fill layer 402 may be formed from polycrystalline silicon or any other appropriate fill material.

Figure 5:
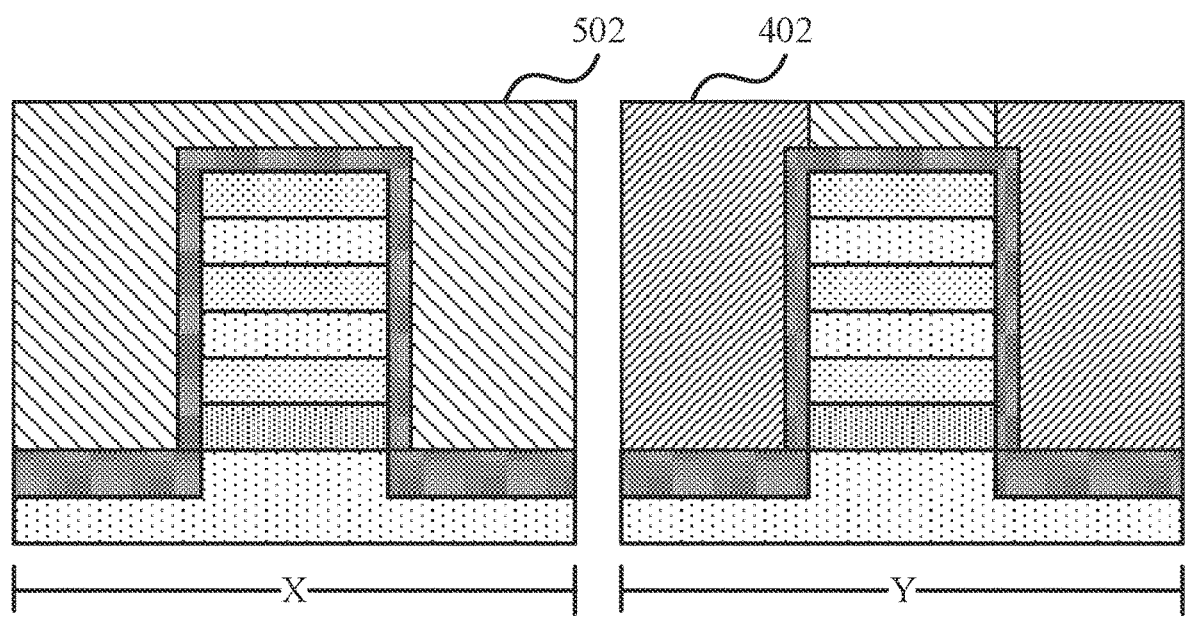
FIG. 5 is a cross-sectional view of cross-sections X and Y of a step in the fabrication of a planar semiconductor device, showing the formation of a trench in the fill material that is filled with a dielectric material to form a dielectric fin over the device stack, in accordance with an embodiment of the present invention.

Referring now to FIG. 5, cross-sections of a step in the fabrication of a semiconductor device are shown, including views along two perpendicular cross-sections, X and Y. An opening in fill layer 402 is etched, for example using an appropriate photolithographic process to form a trench that extends over the top of the stack of layers. The trench may be sized to have a width that is smaller than the width of the stack of layers. As will be described in greater detail below, some embodiments may form two trenches, each positioned over respective sides of the stack of layers. After a trench has been etched in the fill layer 402, a dielectric fin 502 may be formed in the trench by any appropriate deposition process. Any dielectric material with appropriate etch selectivity may be used, such as silicon nitride.

Photolithography may include the deposition of a photosensitive mask material. The photosensitive mask material may then be cured in a particular pattern by exposure to an appropriate wavelength of light. Uncured parts of the photosensitive mask material may then be removed, leaving behind a pattern mask. The pattern mask can then be used to etch down into the underlying layer, using a selective anisotropic etch, such as RIE.

Figure 6:
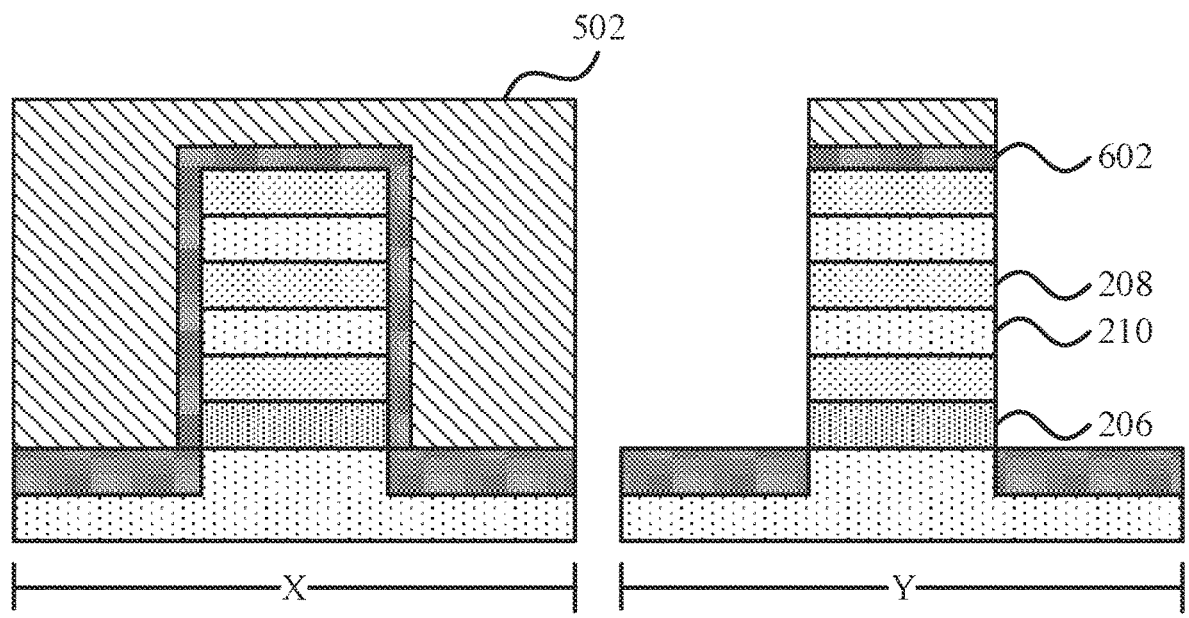
FIG. 6 is a cross-sectional view of cross-sections X and Y of a step in the fabrication of a planar semiconductor device, showing removal of the fill material, in accordance with an embodiment of the present invention.

Referring now to FIG. 6, cross-sections of a step in the fabrication of a semiconductor device are shown, including views along two perpendicular cross-sections, X and Y. The fill layer 402 may be etched away using any appropriately selective isotropic etch or etches. In an illustrative example, an etch may be used that removes exposed portions of the liner 302, thereby exposing sidewalls of the stack of layers, including the first sacrificial layer 206, the second sacrificial layers 208, and the channel layers 210. The liner 302 may thereby be reduced to only that material that is covered by the dielectric fin 502, leaving top spacer 602 between the dielectric fin 502 and the stack of layers.

Figure 7:
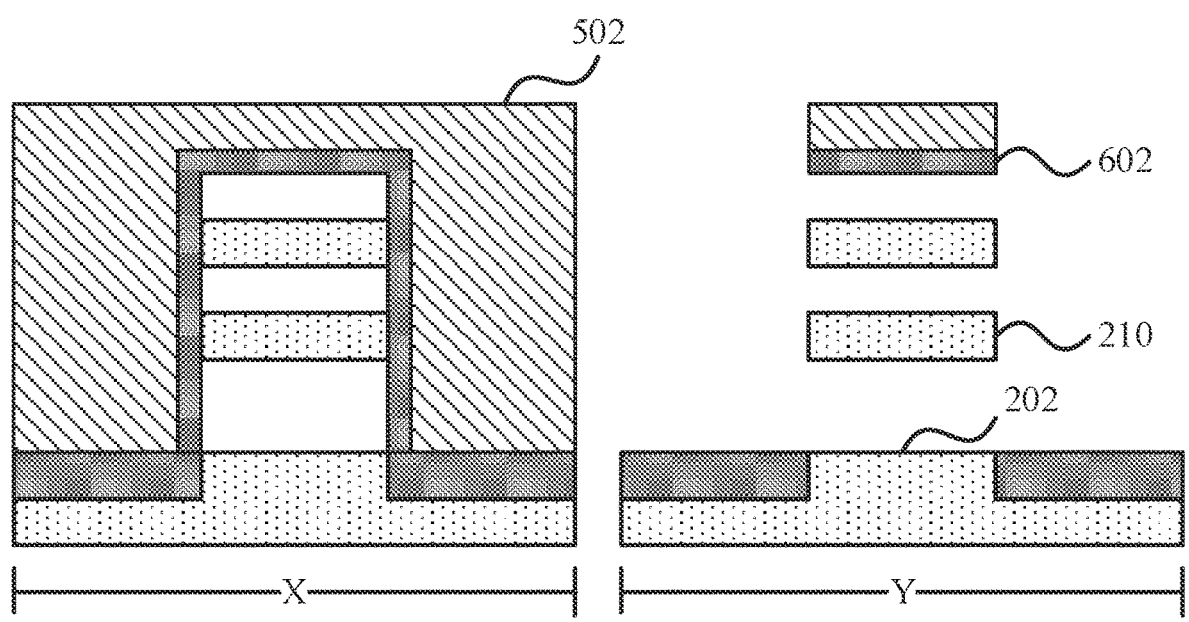
FIG. 7 is a cross-sectional view of cross-sections X and Y of a step in the fabrication of a planar semiconductor device, showing the removal of the first sacrificial layer and the second sacrificial layers from the device stack using a selective etch, in accordance with an embodiment of the present invention.

Referring now to FIG. 7, cross-sections of a step in the fabrication of a semiconductor device are shown, including views along two perpendicular cross-sections, X and Y. The first sacrificial layer 206 and the second sacrificial layers 208 may be selectively etched away, for example using an appropriate isotropic etch. The etch leaves the channel layers 210 in place, suspended by the dielectric fin 502, with open spaces between adjacent channel layers 210 and between the channel layers 210 and the substrate 202.

Notably, this etch may remove both the first sacrificial layer 206 and the second sacrificial layers 208 in a single selective etch, while leaving he channel layers 210 relatively undamaged. In a process that creates body isolation devices elsewhere on the chip, those devices may have the first sacrificial layer 206 removed in a separate etch process, with the second sacrificial layers 208 being removed later to release the channel layers 210. Such a process may then fill the space left by the first sacrificial layer 206 with a dielectric material. For the depicted embodiments, the replacement of the first sacrificial layer 206 may be prevented by the fill layer 402, which covers the sides of the stack. As a result, by the time that the fabrication process reaches the point where channel layers 210, the first sacrificial layer 206 remains in the depicted regions, and these first sacrificial layers 206 are removed at the same time as the second sacrificial layers 208.

Figure 8:
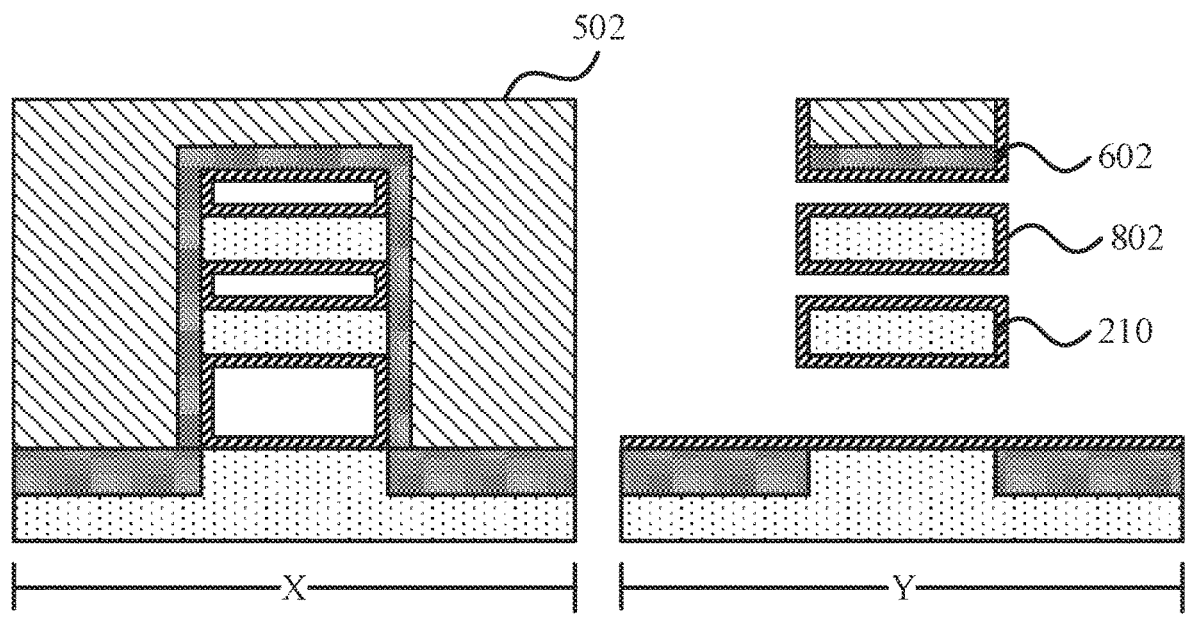
FIG. 8 is a cross-sectional view of cross-sections X and Y of a step in the fabrication of a planar semiconductor device, showing the formation of a gate dielectric on suspended channel layers and on a top surface of the semiconductor substrate, in accordance with an embodiment of the present invention.

Referring now to FIG. 8, cross-sections of a step in the fabrication of a semiconductor device are shown, including views along two perpendicular cross-sections, X and Y. A dielectric layer 802 is conformally formed on all exposed surfaces. For example, this layer may be formed from a gate oxide material that is used in the fabrication of other devices on the chip, such as a high-k dielectric material, but it should be understood that any other appropriate dielectric material may be used instead. Thus, the properties of this dielectric layer 802, such as composition and layer deposition thickness, should match the properties of similar structures formed on other devices, such as the gate dielectric layer of a body isolation nanosheet transistor device that is formed on the same chip.

As used herein, the term, "high-k," refers to a material that has a dielectric constant k that is higher than the dielectric constant of silicon dioxide. Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

Figure 9:
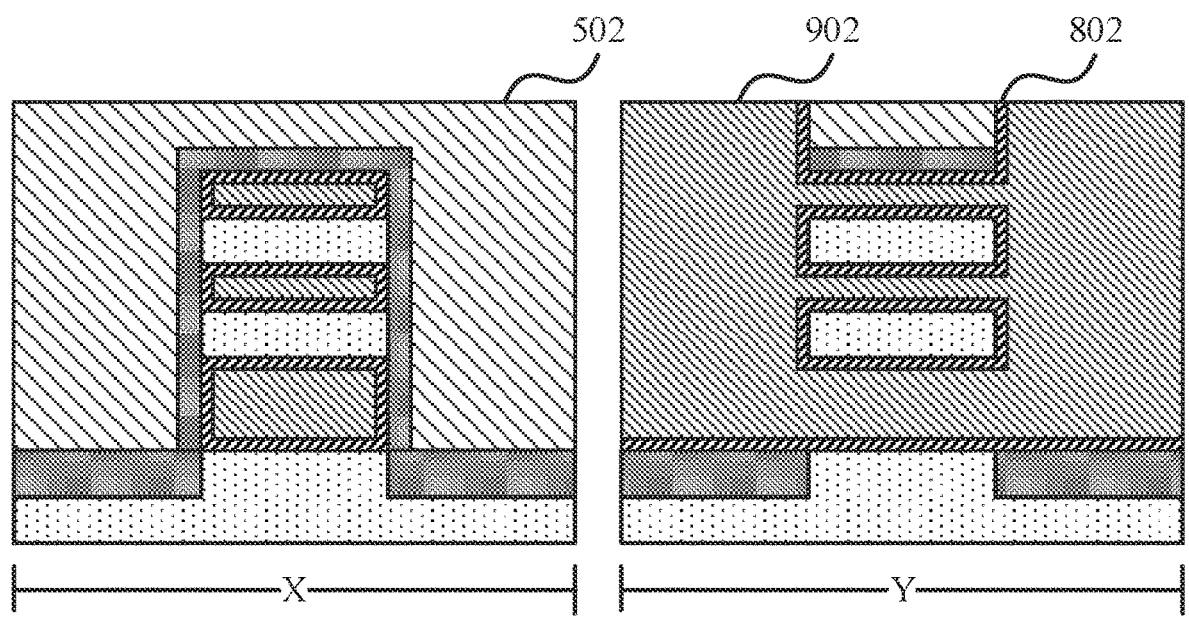
FIG. 9 is a cross-sectional view of cross-sections X and Y of a step in the fabrication of a planar semiconductor device, showing the conformal deposition of a conductive material on the gate dielectric layer, in accordance with an embodiment of the present invention.

Referring now to FIG. 9, cross-sections of a step in the fabrication of a semiconductor device are shown, including views along two perpendicular cross-sections, X and Y. A conductive layer 902 is conformally deposited, using any appropriate conformal deposition process, to fill the space around the channel layers 210 and around the dielectric fin 502. This conductive material may be any appropriate metallic or non-metallic conductor. Appropriate conductive metal may include, e.g., tungsten, nickel, titanium, molybdenum, tantalum, copper, platinum, silver, gold, ruthenium, iridium, rhenium, rhodium, cobalt, and alloys thereof. The conductive layer 902 may alternatively be formed from a doped semiconductor material such as, e.g., doped polysilicon, or from a work function metal, such as titanium nitride, titanium aluminum nitride, tantalum nitride, hafnium nitride, hafnium silicon, and combinations thereof. The composition of this conductive layer 902 may match the composition of a gate conductor and/or work function metal of a body isolation nanosheet transistor formed elsewhere on the integrated chip.

As will be described in greater detail below, this structure may be used to determine the thickness of the dielectric layer 802, which provides information of the structure of similar layers on devices formed elsewhere on the integrated chip. For example, a voltage may be applied between the conductive layer 902 and the substrate 202 to test the thickness of the dielectric layer 802. In particular, the thickness if the dielectric layer 802 is tested along the interface with the substrate 102. Notably, the channel layers 210 may be vestigial in this device, having no source or drain structures attached to them, nor any other meaningful conductive path.

Figure 10:
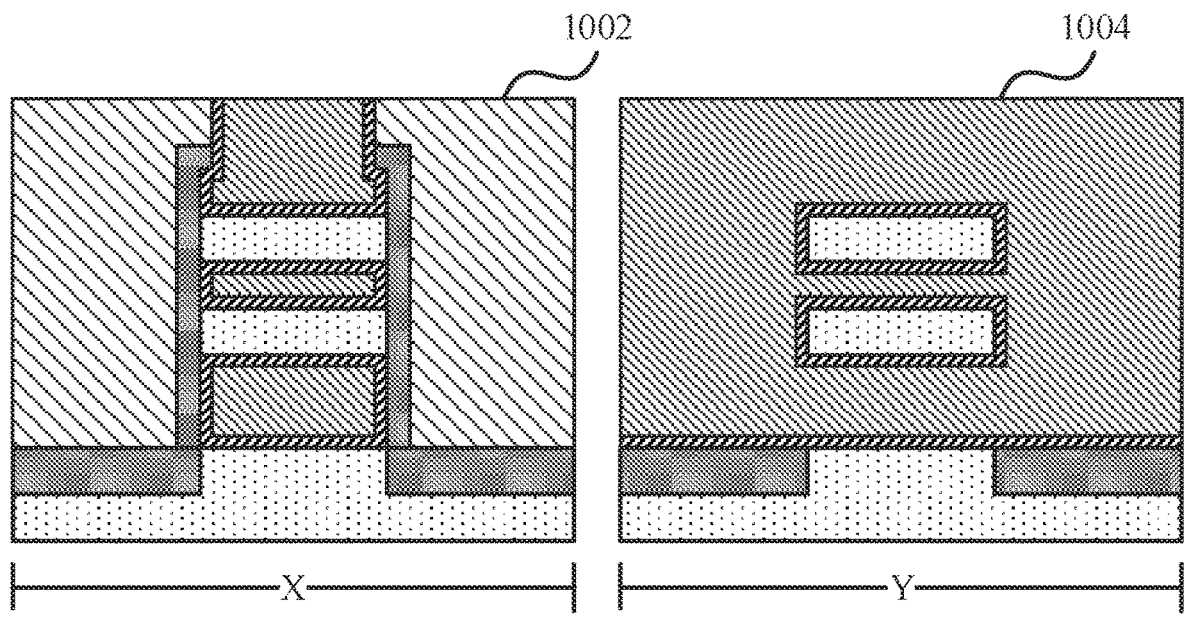
FIG. 10 is a cross-sectional view of cross-sections X and Y of a step in the fabrication of a planar semiconductor device, showing an embodiment where dielectric fins are formed along respective sides of the device stack, such that a conductive contact is formed above the channel layers, in accordance with an embodiment of the present invention.

Referring now to FIG. 10, cross-sections of a step in the fabrication of a semiconductor device are shown, including views along two perpendicular cross-sections, X and Y. These view show an alternative embodiment for the placement of dielectric fins, as shown in FIG. 1, where layers 116 of dielectric material are formed across ends of the stacks 104. In this view, the dielectric structures 1002 are shown as supporting the channel layers 210, with a conductive layer 1004 being formed above and around each of the channel layers 210. Notably, in this view, the conductive layer 1004 may be formed directly above the channel layers 210, which may simplify integration with processes that use similar structures for gate contacts in fabricating body isolation nanosheet transistor devices.

Figure 11:
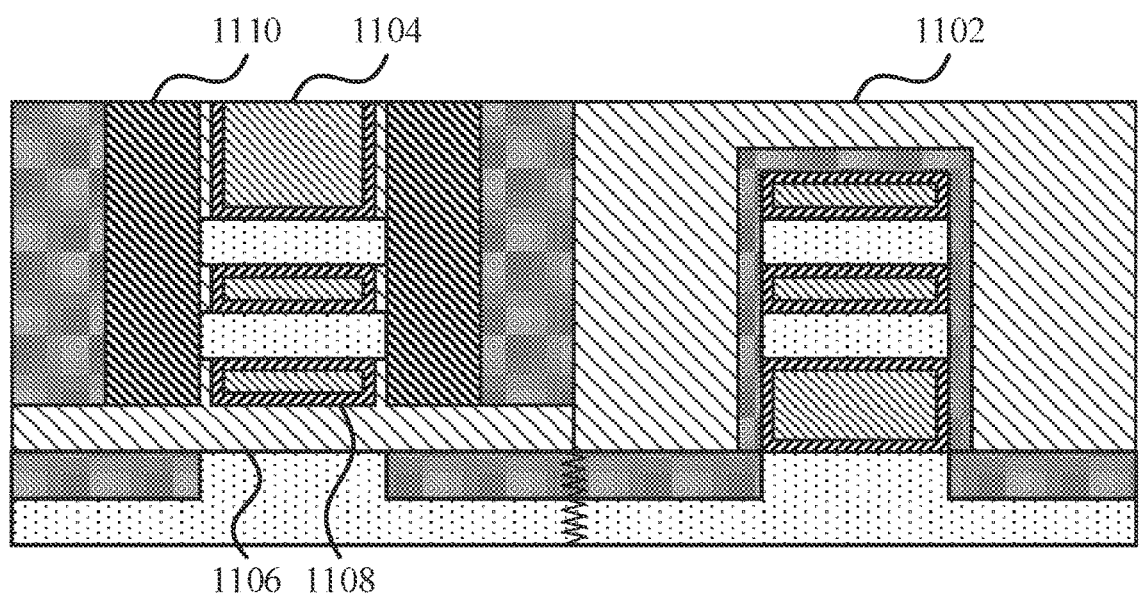
FIG. 11 is a cross-sectional view of cross-sections X and Y of an integrated chip that includes both a planar semiconductor device and a body isolation nanosheet transistor, the body isolation layer, inner spacers, and source/drain structures of the body isolation nanosheet transistor, in accordance with an embodiment of the present invention.

Referring now to FIG. 11, a cross-sectional view of an integrated chip is shown, for example along the X cross-section. This view shows a completed planar device 1102 on the same chip as a nanosheet transistor device 1104. The nanosheet transistor device 1106 includes a body isolation dielectric layer 1106 that is formed between the substrate 202 and the gate dielectric 1108. Additionally, source/drain structures 1110 are formed on side surfaces of the channel layers by epitaxial growth. Although the planar device 1102 and the nanosheet transistor device 1104 are shown as being next to one another on the integrated chip, the two devices may be located at any relative positions on the chip, and their respective functions may be performed without any connection to one another.

Thus, multiple devices may be formed on a single integrated chip, with transistors 1104 being used to perform active circuit functions, and with a planar device 1102 being used to test the physical properties of the gate dielectric 1108, since the same process that is used to form gate dielectric 1108 can also be used to form the dielectric layer on the planar device 1102.

Figure 12:
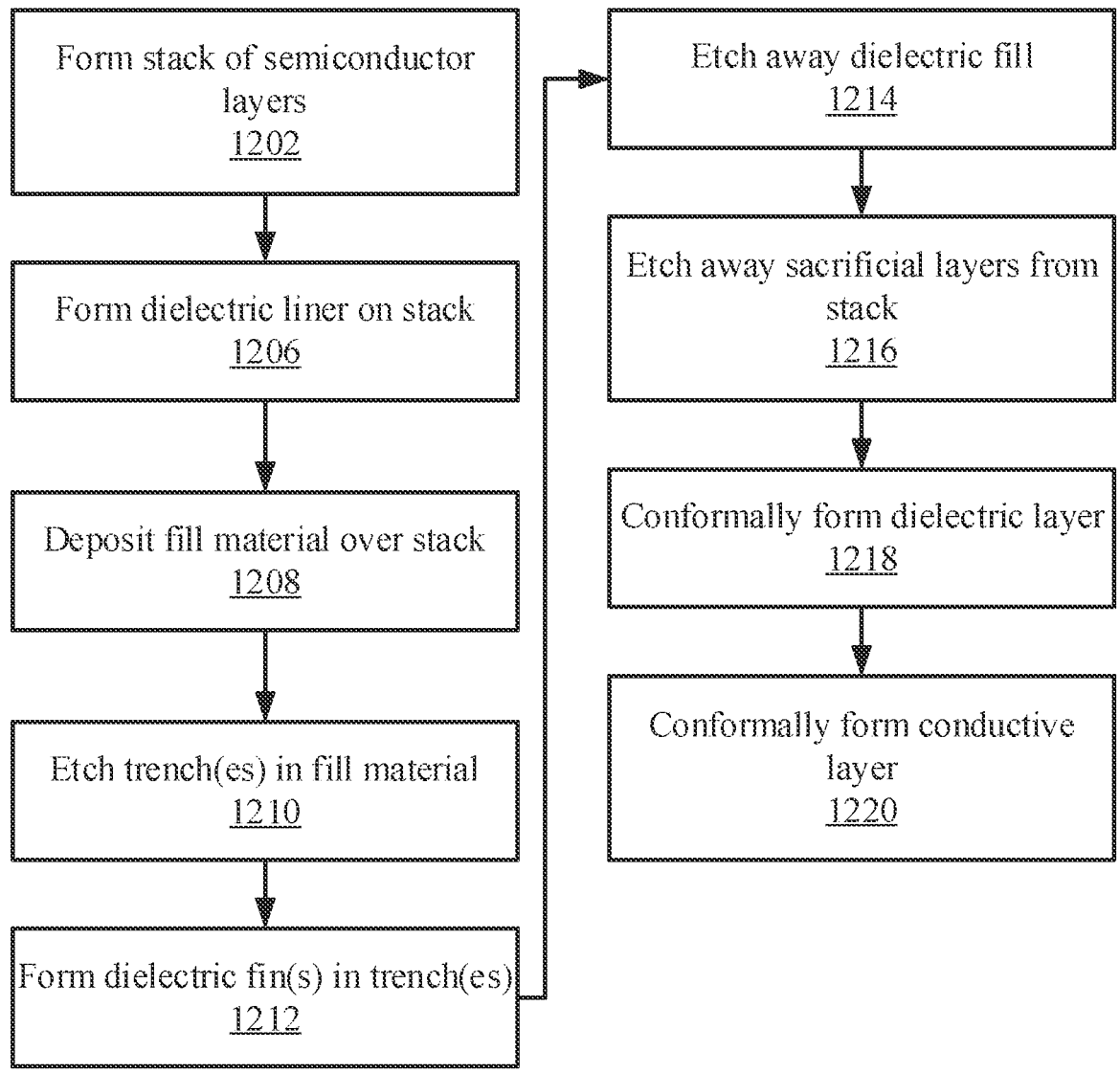
FIG. 12 is a block/flow diagram of a method of forming a planar semiconductor device in a body isolation nanosheet transistor fabrication process, in accordance with an embodiment of the present invention.

Referring now to FIG. 12, a method of fabricating a semiconductor device is shown. Block 1202 forms a stack of semiconductor layers, including a first sacrificial layer 206 and alternating second sacrificial layers 208 and channel layers 210. This stack may be formed by sequential epitaxial growth processes, using respective crystallographically compatible materials for each layer. For example, the first sacrificial layer 206 that is grown from the substrate 202 may be formed from silicon germanium with a germanium concentration of about 40%, the second sacrificial layers 208 may be formed from silicon germanium with a germanium concentration of about 20%, and the channel layers 210 may be formed from elemental silicon. In some embodiments, the substrate 202 may first be processed using an STI process to create STI regions 204, such that the epitaxial growth occurs in a device region on exposed portions of the substrate 202.

Block 1206 forms a dielectric liner 302 over the stack, for example using any appropriate conformal deposition process. Block 1208 then deposits fill material 402 over the stack and the liner 302. Block 1210 etches one or more trenches into the fill material 402, for example using a photolithographic process. In some cases, a single trench may be formed that crosses over the center of the stack, while, in other cases, trenches may be formed over respective ends of the stack. Block 1212 then fills the trench(es) with dielectric material, using any appropriate deposition process, to form dielectric fin(s) 502/1002.

Block 1214 then etches away the fill material 402, using any appropriately selective etch, leaving the dielectric fin(s) 502/1002 in place, supporting the sidewalls of the stack of layers. The etch of block 1214 may include an etch that exposes sidewalls of the semiconductor layers in the stack of layers, in areas that are not covered by the dielectric fin(s) 502/1002. Block 1216 then etches away the first sacrificial layer 206 and the second sacrificial layers 208, using a selective etch that preserves the channel layers 210.

Block 1218 forms dielectric layer 802 using any appropriate conformal deposition process. For example, the dielectric layer 802 may be formed from any dielectric material that is suitable for use as a gate dielectric, such as a high-k dielectric material. Block 1220 then forms a conductive layer 1004 using any appropriate deposition process, such as a conformal deposition that fills the space between channel layers 210. The conductive layer 902/1004 may be formed in block 1220 from any appropriate conductive material, such as a work function metal or some other conductor.

Planar devices, formed as a part of a body isolation nanosheet process, may be used for a variety of purposes, beyond just measuring the thickness of the gate dielectric. For example, such a process may be used to design devices with lower capacitances or larger lengths or widths, which can be challenging with suspended nanosheet devices. Devices may also be designed with high electric field tolerances, as such designs may have nearly double the silicon-to-silicon spacing as compared with suspended nanosheet designs.

Figure 13:
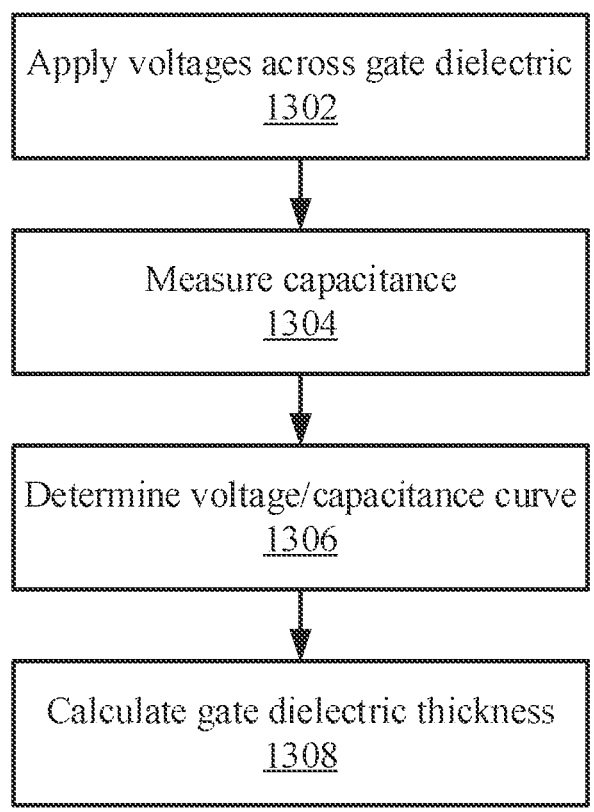
FIG. 13 is a block/flow diagram of a method of determining the thickness of a gate dielectric in a body isolation nanosheet transistor using a planar device that is formed in the same fabrication process, in accordance with an embodiment of the present invention.

Referring now to FIG. 13, a method of measuring the thickness of a gate dielectric layer is shown. As described above, a device may be formed in an integrated chip, using a body isolation fabrication process that creates transistor devices with an isolation dielectric material formed between nanosheet channel layer(s) and the substrate, the isolation dielectric material being distinct from the gate dielectric. Using the process described above, a planar device may be created that includes a layer of gate dielectric material, the gate dielectric material being formed using the same deposition process that is used to deposit gate dielectric layers for the body isolation transistor devices elsewhere on the chip.

To measure the thickness of this gate dielectric layer, block 1302 applies a series of voltages across the gate dielectric layer 802, for example from the conductive layer 902/1004 to the substrate 202 (e.g., by connecting the substrate 202 to ground or to a nominal zero-valued voltage). Block 1304 measures the capacitance, using the applied voltages, so that block 1306 can generate a capacitance/voltage curve. Block 1308 then uses the capacitance/voltage curve to calculate the thickness of the gate dielectric layer 802. The thickness that is calculated can be used as a reference for process variation, as it relates to nanosheet thickness, width, epitaxial growth, and sheet profile effect from a process.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as dwell, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS.

is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Having described preferred embodiments of planar devices with consistent base dielectric (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
   forming a fill over a stack of semiconductor layers, the stack of semiconductor layers including a first sacrificial layer and a set of alternating second sacrificial layers and channel layers;
   forming a dielectric fin over the stack of semiconductor layers;
   etching away the first sacrificial layer and the second sacrificial layers, leaving the channel layers supported by the dielectric fin over an exposed substrate surface;
   conformally depositing a dielectric layer on the exposed substrate surface, the dielectric layer having a consistent thickness across the exposed substrate surface; and
   depositing a conductive material over the dielectric layer.

2. The method of claim 1, wherein conformally depositing the dielectric layer on the exposed substrate surface includes depositing high-k dielectric material directly on the exposed substrate surface.

3. The method of claim 1, wherein depositing the conductive material over the dielectric layer includes depositing conductive material directly on the dielectric layer.

4. The method of claim 1, wherein the conductive material is a work function metal.

5. The method of claim 1, wherein the dielectric fin prevents formation of source/drain structures on the channel layers during an epitaxial growth process.

6. The method of claim 1, further comprising conformally depositing a dielectric liner on the stack of semiconductor layers, before forming the fill.

7. The method of claim 6, further comprising etching away the dielectric liner from sidewalls of the stack of semiconductor layers, after forming the dielectric fin, leaving a portion of the dielectric liner on a top surface of the stack of semiconductor layers, under the dielectric fin.

8. The method of claim 1, wherein forming the dielectric fin includes forming a pair of dielectric fins that cover respective sidewalls of the stack of semiconductor layers.

9. The method of claim 1, wherein the first sacrificial layer and the second sacrificial layer are formed from silicon germanium, with the first sacrificial layer having a higher germanium concentration than the second sacrificial layers.

10. The method of claim 9, wherein etching away the first sacrificial layer and the second sacrificial layers is performed with a single etching process.

11. A semiconductor device, comprising:
    a dielectric layer directly on a top surface of a substrate, the dielectric layer having a consistent thickness across the top surface and including a high-k dielectric;
    a conductive layer on the dielectric layer that includes a work function metal;
    a first dielectric fin on the substrate; and
    a plurality of semiconductor layers, vertically stacked above the dielectric layer, supported by the first dielectric fin.

12. The semiconductor device of claim 11, wherein the semiconductor device has no source or drain structure in direct contact with the plurality of semiconductor layers.

13. The semiconductor device of claim 11, further comprising a dielectric liner between the first dielectric fin and the plurality of semiconductor layers.

14. The semiconductor device of claim 13, wherein the dielectric liner includes a top portion between the first dielectric fin and a top surface of an uppermost semiconductor layer in the plurality of semiconductor layers.

15. The semiconductor device of claim 11, further comprising a second dielectric fin, wherein the first dielectric fin and the second dielectric fin support respective sides of the plurality of semiconductor layers.

16. An integrated chip, comprising:
    a transistor device, comprising:
      a body isolation layer on a substrate;
      a nanosheet channel over the body isolation layer;
      a gate conductor; and
      a gate dielectric material between the gate conductor and the body isolation layer; and
    a planar device, comprising:
      a gate dielectric material directly on a top surface of the substrate, the gate dielectric material having a consistent thickness across the top surface;
      a conductive layer on the dielectric layer;
      a first dielectric fin on the substrate; and
      a semiconductor layer supported by the first dielectric fin.

17. The integrated chip of claim 16, wherein the planer device has no source or drain structure in direct contact with the semiconductor layer.

18. The integrated chip of claim 16, wherein the planar device further comprises a second dielectric fin, wherein the first dielectric fin and the second dielectric fin support respective sides of the semiconductor layer.

19. The integrated chip of claim 16, wherein the gate dielectric material of the planar device includes the same high-k gate dielectric material as the gate dielectric material of the transistor device.

* * * * *